United States Patent [19]

Onizuka

[11] Patent Number: 4,918,594
[45] Date of Patent: Apr. 17, 1990

[54] METHOD AND SYSTEM FOR LOGICAL SIMULATION OF INFORMATION PROCESSING SYSTEM INCLUDING LOGIC CIRCUIT MODEL AND LOGIC FUNCTION MODEL

[75] Inventor: Nobuhiko Onizuka, Hadano, Japan

[73] Assignee: Hitachi, Ltd., Tokyo, Japan

[21] Appl. No.: 11,068

[22] Filed: Feb. 4, 1987

[30] Foreign Application Priority Data

Feb. 7, 1986 [JP] Japan ................................ 61-23782

[51] Int. Cl.⁴ .......................... G06F 15/00; G06F 9/00
[52] U.S. Cl. .................................. 364/200; 364/232.3;
364/262.4; 364/264; 364/274.1; 364/300;
364/488; 364/578
[58] Field of Search ... 364/200 MS File, 900 MS File,
364/578, 488, 300; 371/23

[56] References Cited

U.S. PATENT DOCUMENTS

| | | | |
|---|---|---|---|
| 4,342,093 | 7/1982 | Miyoshi | 371/23 X |
| 4,527,249 | 7/1985 | Van Brunt | 364/578 |
| 4,628,471 | 12/1986 | Schuler et al. | 364/578 |
| 4,635,218 | 1/1987 | Widdoes, Jr. | 364/578 |
| 4,656,580 | 4/1987 | Hitchcock, Sr. et al. | 364/200 |
| 4,713,606 | 12/1987 | Laviron | 364/578 |
| 4,725,975 | 2/1988 | Sasaki | 364/900 |
| 4,763,289 | 8/1988 | Barzilai et al. | 364/578 |
| 4,782,440 | 11/1988 | Nomizu et al. | 364/200 |

FOREIGN PATENT DOCUMENTS

| | | | |
|---|---|---|---|
| 0160944 | 11/1985 | European Pat. Off. | 364/578 |
| 59-148971 (A) | 8/1984 | Japan . | |
| 59-151247 (A) | 8/1984 | Japan . | |
| 59-195751 (A) | 11/1984 | Japan . | |
| 60-91455 | 5/1985 | Japan | 364/578 |
| 60-254351 | 12/1985 | Japan | 364/578 |

OTHER PUBLICATIONS

Zwolinski et al, "The Design of an Hierarchical Circuit-Level Simulator", Electronic Design Automation (EDA 84), Conference Publication No. 232, pp. 9-12, Mar. 1984.

Primary Examiner—Thomas C. Lee
Attorney, Agent, or Firm—Kenyon & Kenyon

[57] ABSTRACT

A logical simulation system for a data processor includes a logic circuit model constituting a part of logic of the data processor to be tested with basic logic elements capable of calculating operation processes in detail, a logic function model describing functional operations of the other logic of the data processor in terms of machine word instructions for executing functional operations of the other logic at a high speed, and a communication routine for performing data transfer between both the models and controlling the execution of instructions. The processings for executing individual instructions contained in a test program are shared between both the models through the medium of the communication routine.

10 Claims, 3 Drawing Sheets

METHOD AND SYSTEM FOR LOGICAL SIMULATION OF INFORMATION PROCESSING SYSTEM INCLUDING LOGIC CIRCUIT MODEL AND LOGIC FUNCTION MODEL

BACKGROUND OF THE INVENTION

The present invention relates to a method of logically simulating a data processing apparatus and a system for carrying out the method.

Figure 2:
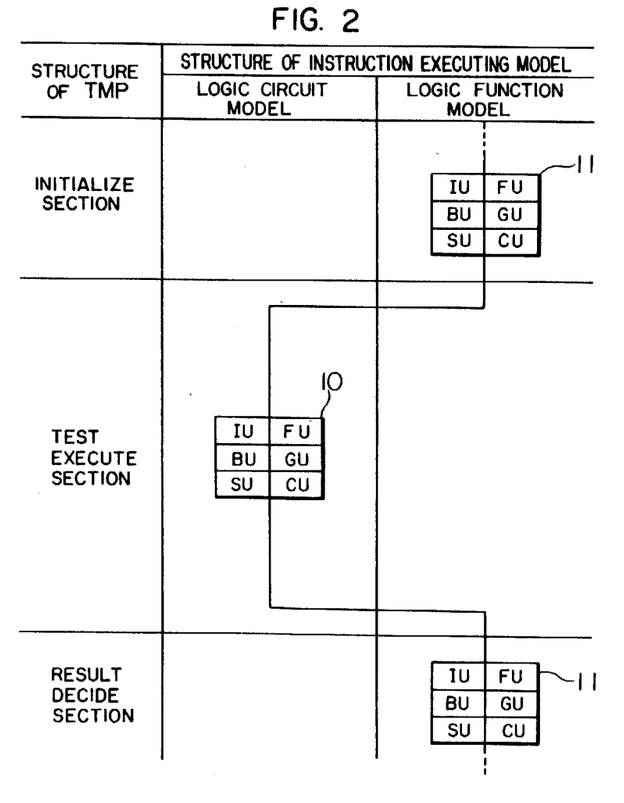
FIG. 2 is a view for illustrating the principle of operation of a known logical simulation system.
Figure 3:
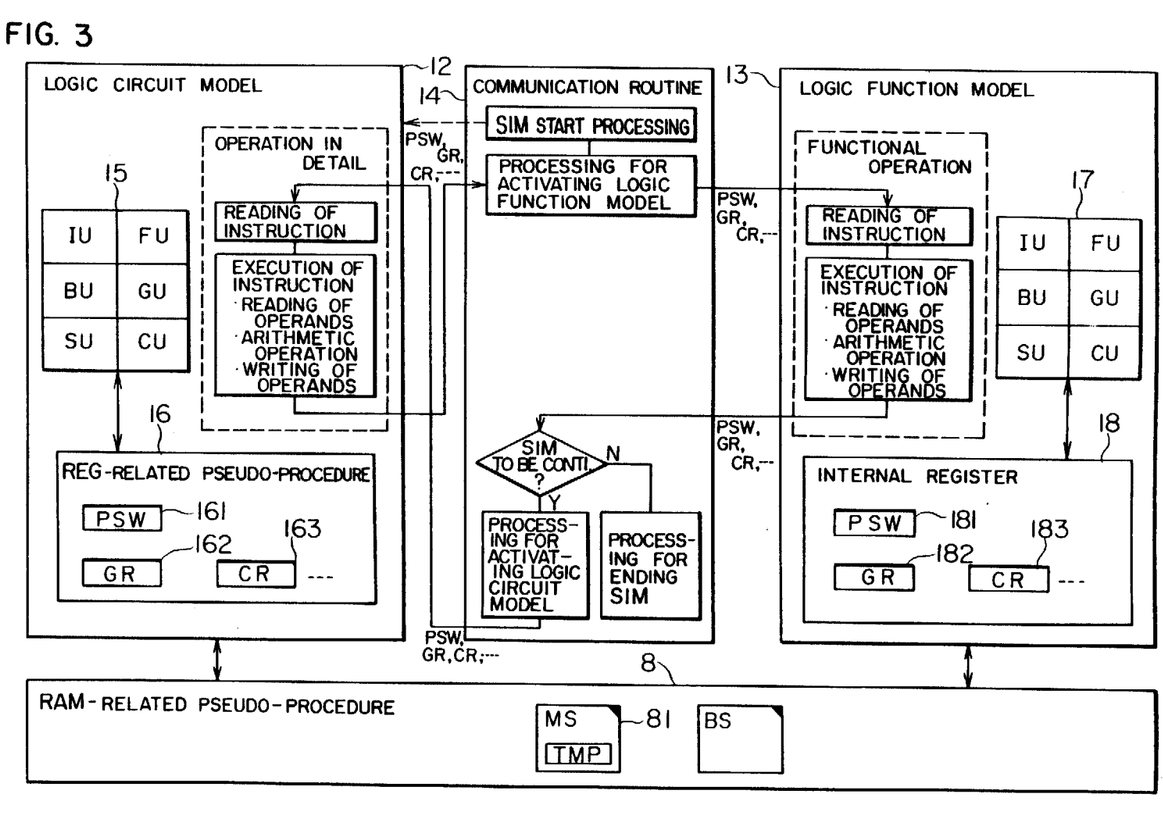
FIG. 3 is a view for illustrating a system structure and operation of the known logical simulation system described in principle in FIG. 2.

A technique for logical simulation of a data or information processing apparatus has heretofore been known, as is disclosed in Japanese Patent Application Laid-Open No. 148971/1984 (JP-A-59-148971). The working principle of this known logical simulation is illustrated in FIG. 2, while the relevant system structure is shown in FIG. 3.

In the first place, the working principle of the prior art logical simulation technique will be described by referring to FIG. 2.

A test program (hereinafter referred to as TMP in abbreviation) for a data processing apparatus is basically composed of three portions or sections, i.e. an initializing section for preparing initial data required for performing the test, a test executing section for executing the test, a result deciding section for checking and deciding the results of the test.

The TMP is loaded in a storage (hereinafter also referred to as RAM-related pseudo-procedure) which can be accessed from a logic circuit under test (hereinafter also referred to as the logic circuit model), wherein the logic circuit under test is activated by simulation data to thereby perform the logic simulation by executing the TMP placed in the storage or the RAM-related pseudo-procedure.

In conjunction with the execution of the logical simulation of a data processing apparatus, it is noted that when the TMP is executed straightforwardly as the input data for performing the logical simulation, the initializing section and the result judging or deciding section for which the logical simulation is inherently unnecessary will be executed, so that it takes enormous computer operation time because the speed at which instructions for logical simulation are executed is generally lower than the speed of executing the real machine instruction by a factor of $10^8$ to $10^9$. The initializing section and the result deciding section of the TMP are inherently destined for performing preprocessing and post-processing for logical recognition and confirmation of the test aimed by the TMP, and a string of instructions to be executed by these sections have been previously logically confirmed by means of other TMP. The number of instruction steps to be executed in the initializing section and the result deciding section is generally on the order of several times to several thousand times as large as the number of the instruction steps to be executed in the test executing section of the TMP. However, since the computer running time is imposed with limitation, it is impossible to execute the TMP for the logical simulation to the last bit of the TMP, when it is of a large scale.

Such being the circumstance, in the case of the aforementioned known data processing apparatus, a logic function model is connected to the logical simulation system in such an arrangement in which instead of logically simulating each of the logic circuits one by one, the instructions of the TMP are executed at a high speed at the functional level by describing and executing the functional operation procedures of the instructions so that the results of execution of the instructions can be made available at an increased speed. To this end, the initializing section and the result deciding section of the TMP are executed with the aid of the logic function model, while only the test executing section is executed by a logic circuit model which is a logic design array composed of basic logic elements which are capable of calculating operation process in detail, with a view to accomplishing the execution of the TMP more effectively. In general, the speed at which instruction is executed by the logic function model is higher than the instruction executing speed of the logic circuit model by a factor of $10^3$ to $10^4$.

In FIG. 2, a reference numeral 10 denotes a group of logic units of a logic circuit model, and 11 denotes a group of operational functions of a logic function model. In those groups, a symbol IU represents an instruction control unit, BU represents a buffer control unit, FU represents a floating point arithmetic operation unit, GU represents a general-purpose arithmetic operation unit, SU represents a storage control unit, and CU represents a common control unit.

Referring to FIG. 2, the TMP is executed in the manner mentioned below. At first, instructions of the initialize section are executed by the logic function model at a high speed. When an operation mode change-over instruction is detected upon completed execution of the instructions of the initialize section, the instruction executing model is changed over from the logic function model to the logic circuit model. For the purpose of changing over the operative model between the logic function model and the logic circuit model, two types of instructions are newly prepared for realizing the switching from the former to the latter and vice versa. When a given model detects the instruction commanding the switching from one to the other model, execution of the current instruction by the given model is interrupted, being followed by activation of the other model through a communication routine. Subsequently, the instructions belonging to the test executing section are executed in the logic circuit model. When the operative model switch instruction is detected upon completed execution of the instructions belonging to the test executing section by the logic circuit model, the instruction executing model is reversely switched from the logic circuit model to the logic function model. With the logic function model, the instructions belonging to the result decision section are executed at a high speed. At the end of execution of the instructions belonging to the result deciding section, the logic function model starts to execute the instructions belonging to the initialize section of a succeeding test. Subsequently, the process mentioned above is repeated for executing sequentially the individual testing sections of the TMP.

Next, the system structure and operations of the prior art logical simulation technique will be described in detail by referring to FIG. 3.

The logic circuit model 12 is composed of a group of logic units 15 composed of basic logic elements capable of calculating operation processes in detail such as IU (instruction control unit), BU (buffer control unit), FU (floating point operation unit), GU (general-purpose operation unit), SU (storage control unit), CU (common control unit) and the like which cooperate to constitute a data processing system to be tested, and a register(-REG)-related pseudo-procedure 16 (hereinafter referred to as REG-related pseudo-procedure in abbreviation) which includes CPU status words 161 (hereinafter referred to as PSW in abbreviation) dispersed among the aforementioned individual units, a general-purpose register 162 (hereinafter referred to as GR in abbreviation), a control register 163 (hereinafter referred to as CR in abbreviation) and the like.

The logic function model 13 is, so to say, a sort of pseudo-procedure describing the functional operations of an ordinary data processing apparatus (which may be the one to be tested) in terms of machine word instructions and includes internally an operational function group of the IU, BU, FU, GU, SU, CU and other units, and internal registers 18 including the PSW 181, GR 182, CR 183 and others in correspondence with the aforemetioned logic circuit model. The communication routine 14 is described in terms of logical simulation language and machine word instructions for performing the control of execution of the instructions and data transfer between the logic circuit model 12 and the logic function model 13. The memory-related pseudo-procedure 8 (hereinafter referred to as RAM-related pseudo-procedure) defines memory chips with the function of the logical simulation for a variety of memories incorporated in the data processing apparatus under test and describes the access operations to the memory chips in terms of the logical simulation language and a common program language. Both the logic circuit model 12 and the logic function model 13 can make access in common to the RAM-related pseudo-procedure 8.

Now, exemplary logical simulation operation realized by the hitherto known system of the structure described above will be discussed below in detail.

At first, the communication routine 14 performs the processings for starting the logical simulation (SIM) such as initialization, resetting of the logic circuit model 12, generation of clock signal, loading of initial values in the various registers such as PSW 161, GR 162, CR 163 and others. Subsequently, the communication routine 14 activates the processing of the logic function model 13 by utilizing various information inclusive of data placed in the various registers such as PSW 161, GR 162, CR 163 and others. For executing the instructions belonging to the initialize section, the logic function model 13 loads the internal register 18 with the information of the PSW 161, GR 162, CR 163 and others included in the REG-related pseudo-procedure 16 and received by way of the communication routine 14. Subsequently, the logic function model 13 reads out the instruction designated by the PSW 181 in the internal register 18 from the RAM-related pseudo-procedure 8 (e.g. a main storage or MS 81).

When the decoding of the instruction read out has proved that the operands designate the register, the operands as required are read out from the internal register 18 incorporated in the logic function model 13. On the other hand, when operands designate the memory, the requisite operands are read out from the RAM-related pseudo-procedure 8. On the basis of the operands as read out, a predetermined operation is conducted, the result of which is loaded in the internal register 18 of the logic function model 13 when the operands designate the register as the destined storage therefor, while the result of the operation is written in the RAM-related pseudo-procedure 8 when the memory is designated as the destined storage. When execution of the instruction has been completed, the instruction address of the PSW 181 is updated to allow a succeeding instruction to be read out, which instruction is then executed in the similar manner described above. This operation is repeatedly performed for all the instructions contained in the initialize section of the TMP.

Upon completed execution of the instruction of the initialize section, the logic function model 13 interrupts the instruction executing operation and sends the updated contents of the various registers PSW 181, GR 182 and CR 183 as well as other various information to the communication routine 14. On the basis of the information as received, the communication routine 14 makes a decision as to whether or not continuation of the logical simulation is still necessary. If unnecessary, the logical simulation ending processing, such as the displaying of the resulted codes, is performed. On the other hand, when it is decided that the logical simulation is to be continued, the values or data of the PSW 181, GR 182, CR 183 and other registers sent from the logic function model 13 are placed in the REG-related pseudo-procedure 16 included in the logic circuit model 12 which is then activated. For executing the test executing section of the TMP, the logic circuit model 12 refers to the information placed in the PSW through the medium of the communication routine 14 to read out the designated instruction from the RAM-related pseudo-procedure 8. The instruction is decoded. When the operands resulting from the decoding designate the register, the requisite operands are read out from the REG-related pseudo-procedure 16. When the operands designate the memory, the requisite operands are read out from the RAM-related pseudo-procedure 8. With the operands as read out, a predetermined operation is performed. For storage of the result of operation, it is set in the REG-related pseudo-procedure 16 when the operands designate the register as the destined storage thereof, while the result of operation is written in the RAM-related pseudo-procedure 8 when the operands designate the memory. At the end of execution of the instruction, the instruction address of the PSW 161 is updated to allow a succeeding instruction to be read out. The instruction thus read out is executed in a similar manner as described above. This operation is repeatedly performed for all the instructions of the test executing section of the TMP.

When the execution of the instructions contained in the test executing section has been completed, the logic circuit model 12 interrupts the instruction executing operation and sends the updated data placed in the PSW 161, GR 162, CR 163 and other registers together with various data to the communication routine 14. The latter then activates the logic function model 13 with the updated data of the PSW 161, GR 162, CR 163 and other registers together with various information required for the activation. The logic function model 13 places in the internal register 18 the data received from the PSW 161, GR 162, CR 163 and other registers by way of the communication routine 14 for executing instructions included in the result decide section of the TMP. Subsequently, the logic function model 13 reads out the instruction designated by the PSW 181 from the RAM-related pseudo-procedure 8.

Subsequently, execution of the instruction is repeated in the similar manner as the execution of the instruction for the initialize section to complete execution of all the instructions of the result decide section.

When it is found upon completion of execution of the instructions for the result decision section that another test is to be consecutively performed with the TMP, the logic function model 13 executes the initialize section for the next test in the similar manner as described above. Upon completed execution of the instructions of the initialize section for the next test or at the end of the completed execution of the whole TMP, the logic function model 13 interrupts or stops the instruction executing operation and sends to the communication routine 14 the updated data of the PSW 181, GR 182, CR 183 and other registers together with various information.

On the basis of the data and information received from the logic function model 13, the communication routine 14 makes decision as to the necessity of continuation of the logical simulation. When the simulation is found to be continued, the logic circuit model 12 is again activated through the same procedure as described above to repeat the execution of instructions. On the other hand, if it is decided that continuation of the simulation is unnecessary, the logical simulation ending processing such as the displaying of the resulting codes and the like is performed, whereupon the logic simulation procedure comes to an end.

The prior art technique described above suffers a problem mentioned below. Namely, even when the logic circuit model is developed precedingly for a given one unit (e.g. general-purpose operation unit or GU) among a plurality of the logic units which constitute one instruction of the data processing system to be tested, the logical verification of the preceding unit can not be performed through the logical simulation by using the TMP, unless the instruction control unit (IU) for decoding the instruction, the memory control unit (SU) for reading out the operands required for the operation from the memory in response to the request from the IU, the buffer control unit (BU) and the like are available.

Another problem of the prior art system can be seen in the fact that since the logical verification for only a part of the units requires all the other units to be connected, the expected results can not be obtained by performing the logical simulation when any one of the other units suffers logical errors.

Besides, in case the logic circuit model is of a large scale, all the individual AND circuits, OR circuits and the like which constitute the logic circuit model have to be exploded on the computer memory before performing the logical simulation, the capacity of the computer memory used for the logical simulation as well as the time taken for the computer to run is significantly increased, involving extended turn-around time for the job output.

SUMMARY OF THE INVENTION

It is therefore an object of the present invention to eliminate the problems of the prior art technique described above and provide a method and a system for logically simulating a data processing apparatus which are capable of performing logical verification with high efficiency at an increased speed by resorting to the logical simulation using the TMP by executing the logic operations of the IU, SU and BU through the logical function model instead of the logical circuit model, even if the data processing apparatus under test executing individual instructions is constituted by a plurality of logic units.

Another object of the present invention is to provide a logical simulation method and a system for carrying out the same which allow the efficiency of the logical simulation to be enhanced by reducing the scale of the logic circuit model as well as the capacity of computer memory and the computer run time required for execution of the logical simulation and thus reducing the necessary computer resources.

The above and other objects, which will be apparent as description proceeds, can be accomplished by providing a logical simulation system which includes a logic circuit model which constitutes a part of the logic of a data processing apparatus with basic logic elements capable of calculating operation process in detail and which is defined as the unit to be tested, a logic function model whose operational function can be separated at a boundary corresponding to the corresponding operational function of the logic circuit model, and a communication unit provided at the boundary for allowing transfer of various requisite data or information between the logic circuit model and the logic function model and for controlling execution of instructions between both models, wherein the instruction processing procedure are shared between the logic function model and the logic circuit model for execution thereof.

Operation involved in the processing for executing one instruction among a plurality of instruction constituting a TMP will be briefly elucidated below.

In the first place, the instruction execution processing is started in the logic function model. When the functional operation of the logic function model is executed up to the boundary to the function corresponding to that of the unit under test as defined by the logical circuit model, the logic function model stops the instruction execution processing. In connection with the usage of terminology, it is assumed, by way of example, that two units A and B are provided, wherein after completed operation of the unit A, a signal is sent to the unit B which is then operated in response to the reception of the signal. On the assumption, the state in which the operation of the unit A has been completed and the signal is sent to the unit B is described herein such that "execution is performed to the boundary across which transition occurs from the unit A to the unit B". At the time of the interruption, the available information of the logic function model is transmitted to the logic circuit model through the communication unit. In this conjunction, it should be mentioned that the information available from the logic function model at the time of the interruption is the information required for the logic circuit model to perform consecutively the instruction executing processing being performed by the logical function model up to the point in time of the interruption. As will be described hereinafter, this information includes operands (OBR, GR) to undergo the operation of the GU of the logic circuit model, instruction data (IBR) for controlling the GU operation, CPU status word (PSW) and the like. On the basis of the information as supplied, the logic circuit model starts the instruction execution processing in the form to continue the instruction executing processing performed by the logic function model. When execution of the instruction has been completed in the logic circuit model, information available from the logic circuit model at that point in time is transmitted to the logic function model through the communication unit. In response thereto, the logic function model restarts the instruction executing processing in the form of continuing the instruction executing processing performed by the logic circuit model unit then, starting from the boundary to the operational function corresponding to that of the unit under test.

DETAILED DESCRIPTION

Now, the invention will be described in detail in conjunction with an exemplary embodiment thereof by referring to the accompanying drawings.

Figure 4:
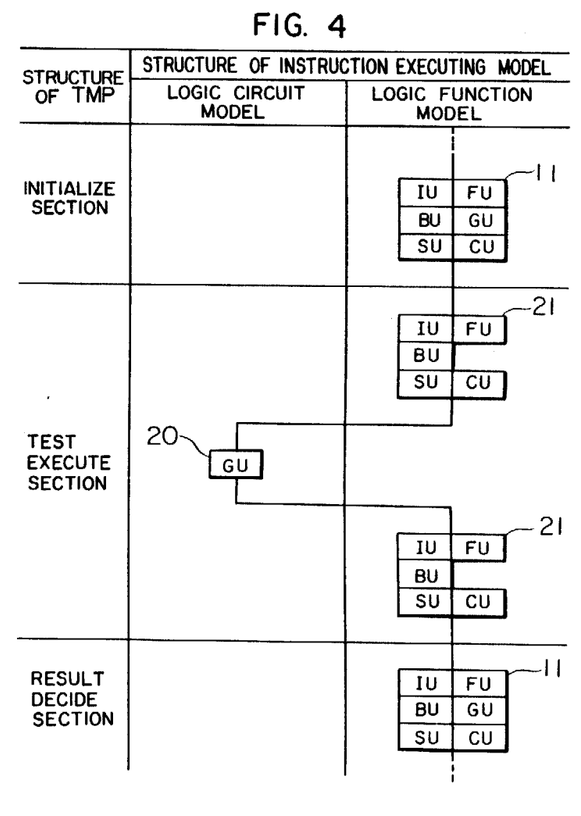
FIG. 4 is a view for illustrating the principle of operation of the logical simulation system according to the embodiment of the invention.

FIG. 4 is a view for illustrating the principle of operation of a logic simulation system according to an embodiment of the present invention.

Referring to FIG. 4, a reference 20 denotes a logic unit belonging to a logic circuit model, and 21 denotes a group of functional units belonging to a logic function model. In general, the processing speed at which instruction is executed in the logic function model is higher than that of the logic circuit model by a factor of $10^3$ to $10^4$. Reference symbols IU, BU, FU, GU, SU and CU represent the same logic units as those described hereinbefore in conjunction with FIG. 2 and constitute a data processing apparatus under test.

In the following description of the preferred embodiment of the invention, it is assumed that a general-purpose operation unit referred to as GU in abbreviation is defined as the logic circuit model.

In operation, instructions of the initialize section of a TMP are first executed in the logic function model at a higher speed in a manner similar to the heretofore known method. When the instructions of the initialize section have been completed in the logic function model, the test executing section of the TMP is also executed consecutively in the logic function model according to the teaching of the present invention. At the time point when the operation in the logic function model has proceeded up to the boundary to the function corresponding to that of the GU defined as the logic circuit model, the logic function model interrupts the processing of the instruction now being executed, whereupon the model in which the instruction under consideration is to be executed is switched from the logic function model to the logic circuit model. In the logic circuit model, the logic unit (GU) 20 performs the instruction executing processing in the form to continue the instruction executing processing performed in the logic function model until then. Upon completion of execution of the instruction in the logic circuit model, the model to execute the instruction switches back from the logic circuit model to the logic function model. In the logic function model, execution of the instruction under consideration is restarted from the boundary of the function corresponding to that of the logic unit (GU) 20 in the form to continue the execution processing performed in the logic circuit model. Subsequently, by repeating the similar procedure, the individual instructions of the test executing section of the TMP are sequentially executed by the logic circuit model and the logic function model in an alternating manner.

Upon completion of execution of all instructions contained in the test executing section of the TMP through both the models, the logic function model starts to execute instructions of the result deciding section in continuation, as is in the case of the hitherto known simulation method. At the end of execution of the instructions of the result deciding section of the TMP, the logic function model starts to execute instructions for initialization for a succeeding test. By repeating the procedure described above, all the test executing sections of the TMP are sequentially executed.

Figure 1:
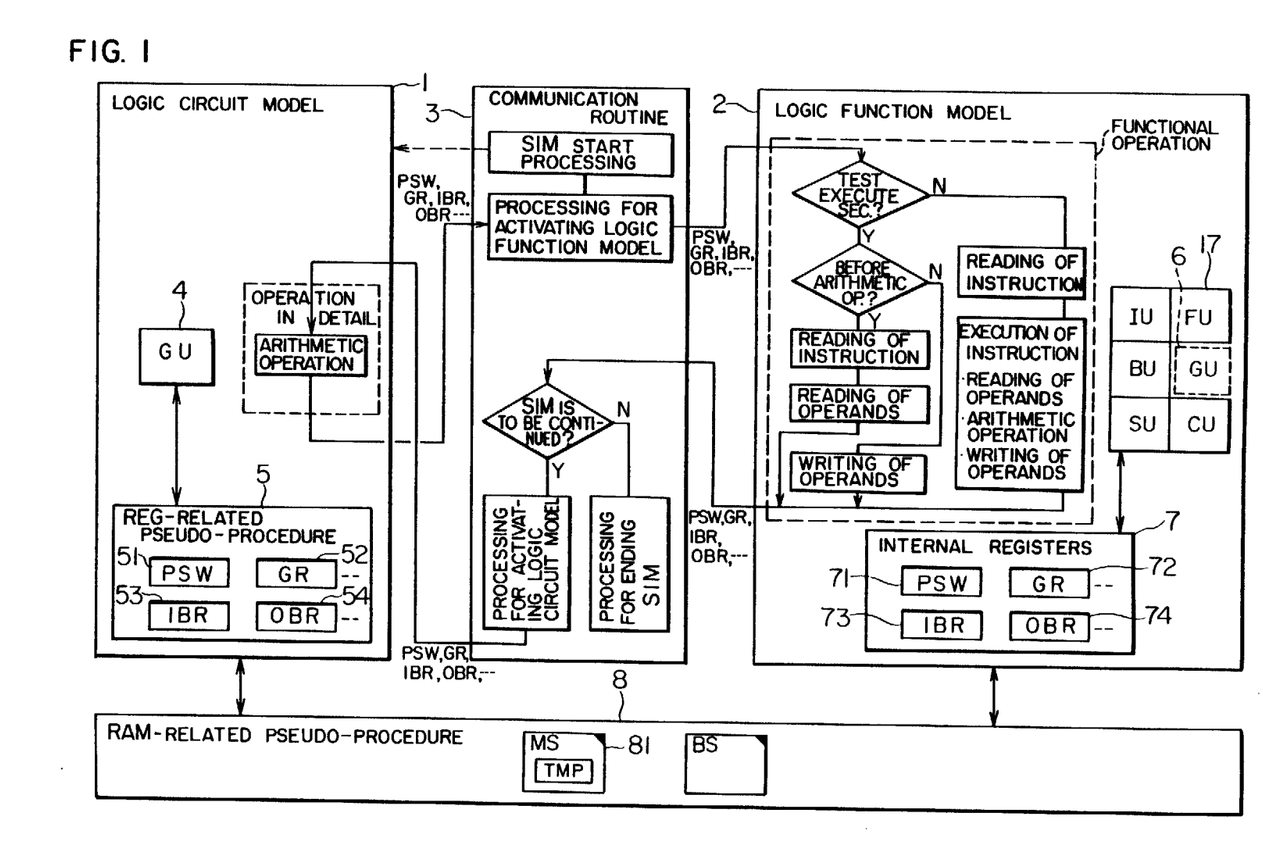
FIG. 1 is a view for illustrating a system structure and operation of a logical simulation system according to an exemplary embodiment of the present invention.

Next referring to FIG. 1, description will be made in detail of the system structure and operation of the logical simulation system according to an embodiment of the present invention.

The logic circuit model 1 is composed of a logic unit (GU) 4, which may be constituted by the same basic logic elements as those described hereinbefore in conjunction with FIG. 3 for performing general-purpose operation in a data processing apparatus under test, and a REG-related pseudo-procedure 5 including PSW 51, GR 52 and others provided in association with the logic unit (GU) 4, as well as an instruction buffer register 53 (hereinafter referred to as IBR in abbreviation) required for the interfacing operation with other units, an operand buffer register 54 (hereinafter referred to as OBR in abbreviation) and the like. On the other hand, the logic function model 2 is constituted by the same logic function model as described hereinbefore by referring to FIG. 3 and additionally includes a novel function to interrupt and restart the processing for executing an instruction at the boundary of the function 6 correspond to that of the logic unit (GU) 4. The communication routine 3 is described in terms of logical simulation language and machine instruction language and destined for performing transmission of information or data between the logic circuit model and the logic function model and for controlling execution of instructions, as described hereinbefore in conjunction with FIG. 3. The RAM-related pseudo-procedure 8 is the same as the one described by referring to FIG. 3. More specifically, this RAM-related pseudo-procedure 8 defines a memory chip by making use of the function of the logical simulation. The and the memory chip can be accessed in ON·EX language at a certain time and in a common program language at another time from the logic circuit model, so that the memory chip can be accessed directly from the logic function model.

In the, following, operation of the logical simulation according to the embodiment of FIG. 1 will be described in detail. The communication routine 3 first performs the logical simulation (SIM) initialize processing such as resetting of the logic circuit model 1 for initialization, generation of a clock signal, placing of initial values in the registers such as PSW 51, GR 52 and the like. Subsequently, the logic function model 2 is activated with the contents of the registers PSW 51, GR 52 and the like as well as various data. The logic function model 2 executes instructions of the initialize section of the TMP in the same manner as in the case of the hitherto known method. To this end, in the logic function model 2, the data received from the PSW 51, GR 52 and the like by way of the communication routine 3 are loaded in an internal register 7. The step of loading is followed by the reading-out of the instruction designated by the PSW 71 from the RAM-related pseudo-procedure 8 (e.g. from MS 81). When the decoding of this instruction indicates that operands in the register are designated, the operands are read out from the internal register 7 incorporated in the logic function model 2. On the other hand, when the operands designate the memory, the requisite operands are read out from the RAM-related pseudo-procedure 8. A predetermined operation is then performed on the operands as read out. The result of the operation is placed in the internal register 7 of the logic function model 2 when the register is designated as the destination for storage of the operands while the result of the operation is written in the RAM-related pseudo-procedure 8 when the memory is designated for the storage. At the end of execution of the instruction, the instruction address of the PSW 71 is updated, being followed by the reading-out of a succeeding instruction which is executed in the similar manner as mentioned above. This operation is repeated for all the instructions of the initialize section.

As described hereinbefore, in the case of the hitherto known simulation system, the operation of the logic function model 13 for executing instruction is immediately stopped upon completed execution of the instructions of the initialization section, whereupon the model to execute instruction is switched from the logic function model 13 to the logic circuit model 12 in which the instructions belonging to the test executing section are executed. In contrast, according to the present invention, the logic function model 2 starts to execute the instructions for the test executing section in continuation. Since the instruction to be executed is the one belonging to the test executing section and commands to initiate the execution of instruction, the current stage corresponds to a step labelled "Before Arithmetic Operation" in the flow chart shown within the logic function model 2 in FIG. 1. Thus, the logic function model 2 reads out an instruction designated by the updated PSW 71 from the RAM-related pseudo-procedure 8 and places the instruction in the IBR 73. When the decoding of this instruction indicates that operands designate register, the contents of the register can be used straigntforwardly in performing the operation, since the register contains the operands resulting from the preceding execution of instruction. However, when operands designate memory, the requisite operands are read out newly from the RAM-related pseudo-procedure 8 and placed in the OBR 74. Subsequently, operation is performed on these operands. However, since the general-purpose operation unit GU 4 is defined as the logic circuit model 1 in the case of the illustrated embodiment of the invention, the instruction executing processing is once interrupted at this time point, and the updated data of the GR 72, IBR 73, OBR 74 and the like registers as well as various information, is sent to the communication routine 3, which in turn makes decision as to the necessity of continuing the logical simulation on the basis of the data read out from the TMP by the logic function model 2. When it is decided that continuation of the logical simulation is unnecessary, the logical simulation (SIM) ending processing, such as the display of the resulting codes is performed. On the contrary, when the simulation has to be continued, values of the registers PSW 71, GR 72, IBR 73, OBR 74 and the like supplied from the logic function model are placed in the REG-related pseudo-procedure 5 of the logic circuit model 1, to activate the logic circuit model 1, which in turn refers to the instruction placed in the IBR 53 through the communication routine 3. When the operands in registers are designated, operation is performed by using the data of the other GR 52 and the like. On the other hand, when the operands in the memory are designated, operation is performed by using the data of the OBR 54. Correspondingly, the result of the operation is stored in the GR 52 or other when the register is designated for the storage, while it is stored in the OBR 54 when the memory is designated.

When all the requisite operations have been completed in the logic circuit model 1, the latter sends the updated register data such as GR 52, OBR 54 and others as well as various information to the communication routine 3, which in turn activates the logic function model 2 with the updated data of GR 52, OBR 54 and the like registers and information required for the activation. In the logic function model 2, the data of the registers GR 52, OBR 54 and the like received by way of the communication routine 3 are loaded in the internal register 7, after which the processing of the remaining instructions of the test executing section is performed. The result of the operation placed in the OBR 74 is written in the RAM-related pseudo-procedure 8 when the memory is designated by the operands. On the other hand, when the register is designated for the storage, any further writing operation is unnecessary because the result of the operation has been set in the GR 72 of the internal register 7.

In this manner, execution of one instruction comes to an end "through the logic function model 2 and hence the logic circuit model 1 and then again through the logic function model 2". Next, the logic function model 2 updates the instruction address of the PSW 71, reads out a succeeding instruction and starts to execute the instruction in the manner described above.

When execution of all the instructions belonging to the test executing section has been completed through the logic circuit model and the logic function model, the logic function model 2 starts the instructions of the result deciding section. More specifically, the logic function model 2 repeats the execution of instruction in the same manner as the execution of instructions of the initialization section, to execute all the instructions of the result decision or evaluation section. When the test is to be continued on the TMP at the time execution of all instructions belonging to the result decision/evaluation section has been completed, the initialization section of a succeeding test is executed in the similar manner as described hereinbefore. Upon completed execution of instructions contained in this initialization section for the succeeding test, the execution processing of instructions for the test execution section is started in the manner described hereinbefore. At the point in time when the instruction executing processing for the test executing section has preceded to the level of the logic circuit following up the procedure described hereinbefore or when the test on the TMP is not to be further continued but the TMP has been executed to the last, the updated register data of the PSW 71, GR 72, OBR 74 and others as well as various information is sent to the communication routine 3, which in turn makes decision as to the necessity of continuing the logical simulation on the basis of the data and information received from the logic function model. When it is decided that the logical simulation has to be continued, the logic circuit model 1 is once again activated through the procedure described hereinbefore, whereby the logic circuit model 1 repeats execution of instructions. On the other hand, when the logical simulation is not to be continued, the logical simulation (SIM) ending processing such as the display of the resulted codes is performed, whereupon the logical simulation comes to an end.

It should be mentioned that the present invention can be equally applied to the case where the names and the number of the logic units constituting the logic circuit model 1 and the logic function model 2 differ from those of the illustrated embodiment.

Further, the invention can be applied equally to the case where logic circuits of a real machine are connected directly by way of an adapter system for converting signal level and transmission.

According to the teaching of the invention in the illustrated embodiment, it is possible to conduct the logical simulation with the TMP by preparing the logic circuit model for a part of the logic units constituting a data processing apparatus to be tested. Accordingly, the logics of those units developed precedingly can be verified at an earlier time point with high efficiency or yield by using the TMP.

Further, since the logic circuit model for only a part of the logic units are used, the logic circuit model can be prepared on a small scale, whereby significant reduction in the capacity of the computer memory and the running time of the computer used in the logical simulation can be attained to another advantage.

As will be appreciated from the foregoing description, it is now made possible in accordance with the present invention that when a data processing apparatus is constituted by a plurality of logic units, the logical simulation can be carried out with the TMP by preparing the logic circuit model for only a part of the logic units. Consequently, the logic circuit model may be of a small scale, which in turn allows the memory capacity of the computer as well as the running time thereof to be reduced significantly for performing the logical simulation.

I claim:

1. A logical simulation method executing by a computer for simulating operation of a data processing system that includes a plurality of logic units using a logic function model defined by a pseudo-procedure describing functional operations of the data processing system in terms of machine language instructions and using a logic circuit model defined by at least one of the logic units composed of a plurality of basic logic elements, wherein a communication routine performs a data transfer between said logic circuit model and said logic function model and wherein said communication routine controls execution of one instruction to be tested, comprising the steps of:
   (a) executing by means of said logic circuit model, a logical operation of a logic circuit associated with some of said plurality of logic units to execute said one instruction; and
   (b) executing in response to termination of step (a) a functional operation by said logic function model of logic units of said plurality of logic units other than said some of said plurality of logic units wherein said step (b) includes,
   (c) deciding whether or not said one instruction makes appearance in precedence to an operation processing, wherein if said one instruction makes appearance in precedence to the operation processing,
   (d) performing processing for reading out said instruction and operands and wherein when said instruction makes appearance succeedingly to the operation processing,
   (e) performing processing of writing operands of said instruction.

2. A logical simulation method according to claim 1, wherein said step (a) includes a substep of waiting for the processing of said one instruction performed by said operational unit.

3. A logical simulation system for simulating operation of a data processing system that includes a plurality of logic units, the simulation system comprising a logic function model defined by a pseudo-procedure describing function operations of the data processing system in terms of machine language instructions, a logic circuit module comprising one of the plurality of logic units wherein said one of the plurality of logic units comprises a plurality of basic logic elements and a communication routine for performing data transfer between said logic circuit model and said logic function model and for further controlling execution of one instruction to be tested, comprising:
   first means associated with said logic circuit model for executing a logical operation of a logic circuit corresponding to some of said plurality of logic units to execute said one instruction;
   second means associated with said logic function model for executing a functional operation of logic units of said plurality of logic units other than said some of said logic units; and
   third means associated with said communication routine for controlling said first and second means;
   wherein said second means comprises fourth means for deciding whether or not said one instruction makes appearance in precedence to an operation processing, wherein if said one instruction makes appearance in precedence to the operation processing, processing for reading out said instruction and operands is performed, while processing of writing operands of said instruction is performed when said instruction makes appearance succeeding the operation processing; and
   said first means comprising fifth means for performing the operation processing of said one instruction.

4. A logical simulation system according to claim 3, wherein said third means comprises:
   sixth means for starting logical simulation, wherein said sixth means includes means for initializing the logic circuit model employed in conjunction with said first means, and means for supplying information to said first means and activating said first means;
   seventh means for supplying information to and activating said first means when the logical simulation is to be continued upon completion of predetermined processing performed by said second means while ending the logical simulation when it is not to be continued; and
   eighth means for activating said second means when the predetermined processing is completed by said first means.

5. A logical simulation system according to claim 3, wherein said fourth means decodes said instruction and performs read/write operation to either one of a register or a memory in accordance with designation by the operands, said fifth means performing operation on the basis of said register or memory.

6. A computer implementing method for logically simulating a data processing system using a logic function model comprising an internal register and a plurality of logic units, said logic function model describing functional operations of the data processing system in terms of machine language instructions, a logic circuit model comprising a register related pseudo procedure and a subset of said plurality of logic units, wherein said subset of logic units comprises a plurality of basic logic element, and a communication routine for performing data transfers between said logic circuit model and said logic function model and for controlling the execution of an instruction to be tested, comprising the steps of:

(a) executing said instruction in said logic function model;

(b) detecting, during execution of said instruction in step (a), if said subset of logic units is to be utilized;

(c) stopping execution of said instruction in said logic function model when there is detection that said subset of logic units is to be utilized;

(d) continuing execution of said instruction in said logic circuit model after stopping execution of said instruction in said logic function model;

wherein step (a) comprises the substeps of:
 i. detecting whether said instruction precedes or follows an operation processing;
 ii. if said instruction precedes an operation processing, performing processing for reading out said instruction and operands; and
 iii. if said instruction follows said operation processing, performing processing of writing operands.

7. The method of claim 6 further comprising the steps of:

(e) after step (c) determining if the simulation process is to continue; and (f) if it is determined to continue the simulation process, transferring data values from internal registers of said logic function model to said register related pseudo procedure of said logic circuit model.

8. A system for logical simulation of a data processing system comprising:

logic function model describing functional operations of the data processing system in terms of machine language instructions comprising,
 an internal register,
 a plurality of logic units,
 means for executing an instruction to be tested, and
 means for detecting, during execution of said instruction, if a subset of said plurality of logic units is to be utilized;

logic circuit model comprising,
 a register related pseudo procedure,
 a subset of said plurality of logic units corresponding to said subset to be utilized in accordance with detection by said means for detecting wherein said subset of logic units comprises a plurality of of basic logic elements, and
 means for continuing execution of said instruction when said means for detecting detects that said subset of the plurality of logic units is to be utilized; and communication routine, coupled to said logic function model and said logic circuit model, comprising,
 means for transferring data between said logic function model and said logic circuit model,
 means for controlling execution of said instruction to be tested,
 wherein said logic function model further comprises:
 means for detecting whether said instruction precedes or follows an operation processing;
 means for reading out said instruction and operands when said instruction precedes said operation processing; and
 means for writing operands when said instruction follows said operation processing.

9. The system of claim 8 wherein said communication routine comprises:

means for detecting if the simulation process is to continue; and means, responsive to said means for detecting if the simulation process is to continue, for transferring data values from said internal registers of said logic function model to said register related pseudo procedure of said logic circuit model.

10. A system for logical simulation of a data processing system comprising:

logic function model describing functional operations of the data processing system in terms of machine language instructions comprising,
 an internal register,
 a plurality of logic units,
 means for executing an instruction to be tested, and
 means for detecting, during execution of said instruction, if a subset of said plurality of logic units is to be utilized;

logic circuit model comprising,
 a register related pseudo procedure,
 a subset of said plurality of logic units corresponding to said subset to be utilized in accordance with detection by said means for detecting wherein said subset of logic units comprises a plurality of basic logic elements, and
 means for continuing execution of said instruction when said means for detecting detects that said subset of the plurality of logic units is to be utilized; and communication routine, coupled to said logic function model and said logic circuit model, comprising,
 means for transferring data between said logic function model and said logic circuit model,
 means for controlling execution of said instruction to be tested,
 wherein said logic function model further comprises:
 means for detecting whether said instruction precedes or follows an operation processing;
 means for processing reading out said instruction and operands when said instruction precedes said operation processing; and
 means for processing writing operands when said instruction follows said operation processing; and
 wherein said communication routine further comprises,
 means for detecting if the simulation process is to continue and
 means, responsive to said means for detecting if the simulation process is to continue, for transferring data values from said internal registers of said logic function model to said register related pseudo procedure of said logic circuit model.

* * * * *

UNITED STATES PATENT AND TRADEMARK OFFICE
CERTIFICATE OF CORRECTION

PATENT NO. : 4,918,594
DATED : 17 April 1990
INVENTOR(S) : Nobuhiko ONIZUKA

It is certified that error appears in the above-identified patent and that said Letters Patent is hereby corrected as shown below:

| Column | Line | |
|---|---|---|
| 3 | 16 | Change "aforemetioned" to --aforementioned--. |
| 5 | 45 | Change "exploded" to --executed--. |
| 6 | 20 | Change "procedure" to --procedures--. |
| 9 | 51 | After "registers" insert --,--. |
| 11 | 25 | Change "to" to --as--. |
| 11 | 38 | Change "executing" to --executed--. |
| 12 | 66 | Change "implementing" to --implemented--. |
| 13 | 7 | Change "element," to --elements,--. |
| 13 | 9 | Delete "the". |
| 13 | 58 | Delete "of", second occurrence. |

Signed and Sealed this

Eighth Day of October, 1991

Attest:

HARRY F. MANBECK, JR.

*Attesting Officer*  *Commissioner of Patents and Trademarks*